(12) United States Patent
Hirosaki

(10) Patent No.: US 7,947,198 B2
(45) Date of Patent: May 24, 2011

(54) PHOSPHOR AND LIGHT EMITTING INSTRUMENT

(75) Inventor: Naoto Hirosaki, Tsukuba (JP)

(73) Assignee: National Institute for Materials Science, Tsukuba-Shi, Ibaraki (JP)

( * ) Notice: Subject to any disclaimer, the term of this patent is extended or adjusted under 35 U.S.C. 154(b) by 1090 days.

(21) Appl. No.: 11/631,358

(22) PCT Filed: Jun. 23, 2005

(86) PCT No.: PCT/JP2005/012015
§ 371 (c)(1),
(2), (4) Date: Dec. 29, 2006

(87) PCT Pub. No.: WO2006/003961
PCT Pub. Date: Jan. 12, 2006

(65) Prior Publication Data
US 2008/0303409 A1    Dec. 11, 2008

(30) Foreign Application Priority Data

Jun. 30, 2004  (JP) .................................. 2004-192445

(51) Int. Cl.
*C09K 11/08* (2006.01)
*C09K 11/70* (2006.01)
*C09K 11/02* (2006.01)
*C09K 11/77* (2006.01)

(52) U.S. Cl. .......................... 252/301.4 F; 252/301.4 R

(58) Field of Classification Search ........... 252/301.4 R, 252/301.4 F
See application file for complete search history.

(56) References Cited

U.S. PATENT DOCUMENTS

| 7,238,304 B2 * | 7/2007 | Odaki ........................ 252/301.5 |
| 7,253,446 B2 * | 8/2007 | Sakuma et al. ................. 257/98 |
| 2003/0030368 A1 * | 2/2003 | Ellens et al. .................. 313/503 |
| 2006/0017365 A1 * | 1/2006 | Nagatomi et al. ............. 313/485 |

FOREIGN PATENT DOCUMENTS

| JP | 2005-235934 | 9/2005 |
| JP | 2005-239985 | 9/2005 |
| JP | 2005-336450 | 12/2005 |
| JP | 2006-008721 | 1/2006 |
| JP | 2006-008862 | 1/2006 |
| WO | WO2005/090517 | 9/2005 |

* cited by examiner

*Primary Examiner* — C. Melissa Koslow
*Assistant Examiner* — Matthew E Hoban
(74) *Attorney, Agent, or Firm* — Manabu Kanesaka

(57) ABSTRACT

The present invention aims at providing a chemically stabilized inorganic phosphor which emits orange light or red light at wavelengths longer than the conventional rare-earth activated sialon phosphor and which has a higher luminance.

The solving means resides in an inorganic phosphor design represented by a composition formula $M_a A_b D_c E_d N_e O_f X_g$ and containing: an M element (M is one kind or two or more kinds of element(s) selected from Mn, Ce, Pr, Nd, Sm, Eu, Gd, Tb, Dy, Ho, Er, Tm, Yb, and Lu); a divalent A element (A is one kind or two or more kinds of element(s) selected from Mg, Ca, Sr, and Ba); a trivalent E element (E is one kind or two or more kinds of element(s) selected from B, Al, Ga, and In); a tetravalent D element (D is one kind or two or more kinds of element(s) selected from Si, Ge, and Sn); nitrogen; oxygen (including an oxygen absent condition); and another X element (including an X absent condition); wherein the parameters a, b, c, d, e, f, and g included in the equation are adjusted to and set at particular regions to provide an inorganic phosphor which emits orange light at wavelengths of 570 nm or longer or red light at wavelengths of 600 nm or longer with excellent color rendering property.

11 Claims, 4 Drawing Sheets

A(0.396,0.01,0.594)
B(0.16,0.6,0.24)
C(0.39,0.6,0.01)
D(0.98,0.01,0.01)
E(0.396,0.594,0.01)

PHOSPHOR AND LIGHT EMITTING INSTRUMENT

TECHNICAL FIELD

The present invention relates to a phosphor mainly including an inorganic compound and usage thereof. More particularly, the usage relates to a light emitting instrument for a lighting instrument and for an image displaying apparatus, utilizing the nature possessed by the phosphor, i.e., the property to emit fluorescence at long wavelengths of 570 nm or longer.

BACKGROUND ART

Phosphors have been utilized for vacuum fluorescent displays (VFD), field emission displays (FED), plasma display panels (PDP), cathode ray tubes (CRT), white light emitting diodes (LED), and the like.

In all these usages, it is required to supply an energy to an applicable phosphor to thereby excite it so as to cause it to emit light, and the phosphor is excited by an excitation source having a higher energy such as vacuum ultraviolet light, ultraviolet light, electron beam, blue light, or the like, such that the phosphor is caused to emit visible light.

However, since phosphor is exposed to the aforementioned excitation sources to resultingly cause a problem of deteriorated luminance, thereby necessitating a phosphor, which is free of luminance deterioration. As such, there has been proposed a sialon phosphor as a phosphor exhibiting less luminance deterioration, instead of the conventional silicate phosphor, phosphate phosphor, aluminate phosphor, sulfide phosphor, and the like.

The sialon phosphor is produced by a production process as generally described below.

Firstly, there are mutually mixed silicon nitride ($Si_3N_4$), aluminum nitride (AlN), calcium carbonate ($CaCO_3$), and europium oxide ($Eu_2O_3$) at a predetermined molar ratio, followed by holding for 1 hour at a temperature of 1,700° C. in nitrogen at 1 atm (0.1 MPa), and firing by hot pressing for production (see patent-related reference 1, for example).

It has been reported that α-sialon obtained by the process and activated by Eu ion is established into a phosphor, which is excited by blue light at 450 to 500 nm and caused to emit yellow light at 550 to 600 nm.

However, there have been demanded not only the phosphor which emits yellow light but also phosphor which emit orange light and red light, respectively, for usages such as white LED and plasma display each having an ultraviolet LED as an excitation source. Further, there have been demanded phosphor which emit orange light, red light, and the like, respectively, in a white LED having a blue LED as an excitation source, for an improved color rendering property.

As a phosphor, which emits red light, there has been reported an inorganic substance ($Ba_{2-x}Eu_xSi_5N_8$; where x=0.14 to 1.16) obtained by activating a $Ba_2Si_5N_8$ crystal with Eu, in a scientific literature (see patent-unrelated reference 1) prior to filing of the present application.

There has been further reported a phosphor including, as a host material, a ternary nitride $M_xSi_yN_z$ (M=Ca, Sr, Ba, Zn; where x, y, and z take various values, respectively) of alkali metals and silicon at various compositions, in the second chapter of a publication "On new rare-earth doped M-Si—Al—O—N materials" (see patent-unrelated reference 2).

Similarly, there has been reported $M_xSi_yN_z$:Eu (M=Ca, Sr, Ba, Zn; where z=2/3x+4/3y), in U.S. Pat. No. 6,682,663 (patent-related reference 2).

As sialon phosphor, nitride phosphor, and oxynitride phosphors different from the above, there have been described phosphors including, as host crystals, $MSi_3N_5$, $M_2Si_4N_7$, $M_4Si_6N_{11}$, $MgSi_{11}N_{23}$, $M_{16}Si_{15}O_6N_{32}$, $M_{13}Si_{18}Al_{12}O_{18}N_{36}$, $MSi_5Al_2ON_9$, and $M_3Si_5AlON_{10}$ (where M is Ba, Ca, Sr, or rare earth element) activated with Eu, Ce, or the like in JP-A-2003-206481 (patent-related reference 3), and there has been also described therein a phosphor which emits red light.

Further, LED lighting units utilizing these phosphors are known.

Furthermore, there has been reported a phosphor obtained by activating an $Sr_2Si_5N_8$ or $SrSi_7N_{10}$ crystal with Ce, in JP-A-2002-322474 (patent-related reference 4).

In JP-A-2003-321675 (patent-related reference 5), there have been found a description of a phosphor represented by $L_xM_yN_{(2/3x+4/3y)}$:Z (L is a divalent element such as Ca, Sr, Ba, or the like, M is a tetravalent element such as Si, Ge, or the like, and Z is an activator such as Eu), and a description that addition of a small amount of Al brings about an effect of restricting afterglow.

Further, it has been known that a combination of the phosphor with a blue LED provides a light emitting apparatus for emitting warm color based and slightly reddish white light.

In turn, there has been reported a phosphor configured with various L elements, M elements, and Z elements, as an $L_xM_yN_{(2/3x+4/3y)}$:Z phosphor, in JP-A-2003-277746 (patent-related reference 6).

Meanwhile, although JP-A-2004-10786 (patent-related reference 7) has described a wide variety of combinations concerning L-M-N:Eu, Z types, it has failed to show an effect of improved emission characteristics in case of adopting specific compositions or crystal phases as host materials.

Although the phosphors represented by those of the aforementioned patent-related references 2 through 7 have been reported as ones including various different crystal phases as host materials such that nitrides of divalent elements and tetravalent elements are included as host crystals while providing known phosphors for emitting red light, emission luminances of red light have been insufficient insofar as based on excitation by blue visible light.

Further, the phosphors have been chemically unstable depending on compositions, thereby exhibiting a problem of durability.

Meanwhile, as a lighting apparatus, there has been known a white light emitting diode based on a combination of a blue light emitting diode element with a blue-light absorbing/yellow-light emitting phosphor, which has been practiced in various lighting usages.

Representative examples thereof include JP-2900928 (patent-related reference 8) entitled "Light Emitting Diode", JP-2927279 (patent-related reference 9) entitled "Light Emitting Diode", JP-3364229 (patent-related reference 10) entitled "Casting Material for Wavelength Conversion, Production Method Thereof, and Light Emitting Element", and the like.

The phosphors, which are particularly frequently utilized in these light emitting diodes, are yttrium/aluminum/garnet based phosphors represented by a general formula $(Y, Gd)_3(Al, Ga)_5O_{12}:Ce^{3+}$.

However, the white light emitting diode comprising the blue light emitting diode element and the yttrium/aluminum/garnet based phosphor has a feature to emit bluish white light due to lack of a red component, thereby problematically exhibiting deviation in a color rendering property.

Under such circumstances, there has been investigated a white light emitting diode including two kinds of mixed and dispersed phosphors, such that a red component lacking in case of a yttrium/aluminum/garnet based phosphor is compensated for by an additional red-aimed phosphor.

Examples of such light emitting diodes include those described in JP-A-10-163535 (patent-related reference 11) entitled "White Light Emitting Element", JP-A-2003-321675 (patent-related reference 5) entitled "Nitride Phosphor and Production Method Thereof", and the like.

However, there have been still left problems to be improved concerning an insufficient color rendering property even by these inventions, thereby necessitating a problem less light emitting diode.

Further, the red-aimed phosphor described in JP-A-10-163535 (the patent-related reference 11) includes cadmium, thereby exhibiting a problem of environmental pollution. Contrary, although the red-light emitting phosphor including $Ca_{1.97}Si_5N_8:Eu_{0.03}$ described in JP-A-2003-321675 (the patent-related reference 5) as a representative example do not include cadmium, the phosphors are low in luminance, thereby still necessitating a further improvement of emission intensities thereof.

Referenced Literature/Publication:

Patent-unrelated reference 1: H. A. Hoppe, and four others, "Journal of Physics and Chemistry of Solids", 2000, Vol. 61, pp. 2001-2006

Patent-unrelated reference 2: "On new rare-earth doped M-Si—Al—O—N materials", written by J. W. H. van Krevel, TU Eindhoven 2000, ISBN 90-386-2711-4

Patent-related reference 1: JP-A-2002-363554
Patent-related reference 2: U.S. Pat. No. 6,682,663
Patent-related reference 3: JP-A-2003-206481
Patent-related reference 4: JP-A-2002-322474
Patent-related reference 5: JP-A-2003-321675
Patent-related reference 6: JP-A-2003-277746
Patent-related reference 7: JP-A-2004-10786
Patent-related reference 8: JP-2900928
Patent-related reference 9: JP-2927279
Patent-related reference 10: JP-3364229
Patent-related reference 11: JP-A-10-163535

DISCLOSURE OF THE INVENTION

Problem to be Solved by the Invention

The present invention intends to satisfy such a demand, and has an object to provide a chemically stabilized inorganic phosphor which emits orange light or red light at wavelengths longer than the conventional rare-earth activated sialon phosphors and which has a higher luminance.

It is another object of the present invention to provide a light emitting instrument adopting such a phosphor, for a lighting instrument excellent in color rendering property and for an image displaying apparatus excellent in durability.

Means for Solving the Problem

Under these circumstances, the present inventors have specifically investigated phosphors including, as host materials, inorganic multi-component nitride crystals including trivalent E elements such as Al as main metallic elements in addition to divalent A elements such as Ca and tetravalent D elements such as Si, and have found that phosphors including, as host materials, inorganic crystals having particular compositions emit orange light or red light at wavelengths longer than the conventional rare-earth activated sialon phosphors and have luminances higher than those by the conventionally reported red-aimed phosphors including, as host crystals, nitrides, oxynitrides, or the like.

Namely, the present inventors have earnestly and repeatedly investigated inorganic compounds mainly including nitrides of oxynitrides containing: an M element (M is one kind or two or more kinds of element(s) selected from Mn, Ce, Pr, Nd, Sm, Eu, Gd, Tb, Dy, Ho, Er, Tm, Yb, and Lu) to be matured into a light emitting ion; a divalent A element (A is one kind or two or more kinds of element(s) selected from Mg, Ca, Sr, and Ba); a tetravalent D element (D is one kind or two or more kinds of element(s) selected from Si, Ge, and Sn); a trivalent E element (E is one kind or two or more kinds of element(s) selected from B, Al, Ga, and In); nitrogen; oxygen as required; and another X element as required; and have found that crystal phases having specific compositions are established into phosphors, which emit orange light at wavelengths of 570 nm or longer or red light at wavelengths of 600 nm or longer.

Further, the present inventors have found that adoption of this phosphor allows for obtainment of a white light emitting diode having a higher light-emission efficiency and being excellent in color rendering property with a rich red component.

The present inventors have also found that multi-component oxynitrides including, as main constituent metallic elements, a trivalent element represented by Al, allow for achievement of red emission at a luminance which has never been provided up to now, unlike the ternary nitrides including divalent and tetravalent elements as represented by the conventionally reported $L_xM_yN_{(2/3x+4/3y)}$.

Further, the present invention resides in a novel phosphor including, as a host material, a crystal having a composition and a crystal structure which are fully different from those of $M_{13}Si_{18}Al_{12}O_{18}N_{36}$, $MSi_5Al_2ON_9$, $M_3Si_5AlON_{10}$ (M is Ca, Ba, Sr, or the like) conventionally reported in the patent-related reference 3, and the like, and the sialon such as $Ca_{1.47}Eu_{0.03}Si_9Al_3N_{16}$ described in the eleventh chapter of the patent-unrelated reference 2.

Furthermore, unlike the crystal including Al on the order of several hundreds ppm described in the patent-related reference 5, the phosphors of the present invention include, as host materials, host crystals including a trivalent element represented by Al as main constituent elements thereof.

Generally, phosphors including inorganic host crystals activated with Mn or rare earth element as an emission center element M, exhibit light emission colors and luminances which vary depending on electronic states around the M element. For example, it has been reported that change of host crystals in phosphors each including divalent Eu as an emission center leads to emission in blue, green, yellow, or red color.

Namely, even phosphors having similar compositions exhibit fully different light emission colors and luminances when crystal structures of the host materials or atom positions in the crystal structures for introducing M thereinto are changed, so that such phosphors are regarded as ones different from one another.

The present invention has devised, as host crystals, divalent-trivalent-tetravalent multi-component nitrides different from the conventional ternary nitrides of divalent and tetravalent elements, and devised, as host materials, crystal fully different from the conventionally reported compositions of sialons, and any phosphors including such crystals as host materials have been never reported up to now.

Moreover, the phosphors including the compositions of the present invention as host materials, exhibit red light emission at higher luminance than those phosphors including the conventional crystals as host materials.

The present inventors have earnestly and repetitively conducted investigation in view of the above-described actual situation, and have succeeded in providing phosphors, which exhibit emission phenomena at higher luminances over specific wavelength ranges, respectively, by achieving configurations recited in the following items (1) through (19).

Further, the present inventors have also succeeded in providing a lighting instrument and an image displaying apparatus having excellent properties by achieving configurations recited in items (20) through (27).

Namely, the configurations of the present invention are recited in the following items (1) through (27).

1. A phosphor, characterized in that the phosphor comprises an inorganic compound, which is constituted of an activation element M, a divalent element A, a trivalent element E, a tetravalent element D, nitrogen, oxygen (including an oxygen absent condition), and another element X (including an X absent condition), and which is represented by a composition formula $M_a A_b D_c E_d N_e O_f X_g$ where the parameters a, b, c, d, e, f, and g (b+c+d=1) satisfy all the following conditions:

$0.00001 \leq a \leq 0.15$      (i), $0.01 \leq b \leq 0.6$      (ii), $0.01 \leq c$      (iii), $2/3 \times c \leq d$      (iv), $0.8 \times (2/3 \times b + 4/3 \times c + d) \leq e + f$      (v), $e + f \leq 1.2 \times (2/3 \times b + 4/3 \times c + d)$      (vi), $0 \leq f/(e+f) \leq 0.4$      (vii), and $0 \leq g \leq 0.2$      (viii).

2. The phosphor of item 1, characterized in that the parameter g satisfies:

$0 \leq g \leq 0.01$      (ix).

3. The phosphor of item 1 or 2, characterized in that the parameter f satisfies:

$0 \leq f/(e+f) \leq 0.2$      (x).

4. The phosphor of any one of items 1 through 3, characterized in that the parameter d satisfies:

$0.396 \leq d \leq 0.98$      (xi).

5. The phosphor of any one of items 1 through 4, characterized in that the parameters c and d satisfy:

$0.9 \times c \leq d \leq 1.1 \times c$      (xii).

6. The phosphor of any one of items 1 through 5, characterized in that the activation element M is one kind or two or more kinds of element(s) selected from Mn, Ce, Pr, Nd, Sm, Eu, Gd, Tb, Dy, Ho, Er, Tm, Yb, and Lu; the divalent element A is one kind or two or more kinds of element(s) selected from Mg, Ca, Sr, and Ba; the tetravalent element D is one kind or two or more kinds of element(s) selected from Si, Ge, and Sn; and the trivalent element E is one kind or two or more kinds of element(s) selected from B, Al, Ga, and In.

7. The phosphor of any one of items 1 through 6, characterized in that the phosphor includes Eu in the M element, Ca or Ca and Sr in the A element, Si in the D element, Al in the E element, and N in the X element.

8. The phosphor of any one of items 1 through 7, characterized in that the M element is Eu, the A element is Ca or a mixed composition of Ca and Sr, the D element is Si, and the E element is Al.

9. The phosphor of any one of items 1 through 8, characterized in that the inorganic compound is a $CaAlSiN_3$ crystal including M dissolved therein in a solid state, or a $(Ca,Sr)AlSiN_3$ crystal including M dissolved therein in a solid state.

10. The phosphor of any one of items 1 through 9, characterized in that the inorganic compound comprises single crystal particles having an averaged particle size between 0.1 μm inclusive and 20 μm inclusive, or an aggregation of single crystals.

11. A phosphor characterized in that the phosphor comprises a mixture of: 5 mass % or more of a phosphor comprising the inorganic compound of any one of items 1 through 10; and a remainder comprising an additional crystal phase or amorphous phase.

12. The phosphor of item 11, characterized in that the additional crystal phase or amorphous phase is AlN or a polytype crystal of AlN.

13. The phosphor of item 11, characterized in that the additional crystal phase or amorphous phase is $\beta$-$Si_3N_4$, $\beta$-sialon, or $\alpha$-sialon.

14. The phosphor of item 11, characterized in that the additional crystal phase or amorphous phase is $CaSiN_2$, $Ca_2Si_5N_8$, or $CaSiN_2$, $Ca_2Si_5N_8$ where a part of Ca is substituted by Sr.

15. The phosphor of item 11, characterized in that the additional crystal phase or amorphous phase is an inorganic substance having electroconductivity.

16. The phosphor of item 15, characterized in that the inorganic substance having electroconductivity is oxide, oxynitride, nitride, or a mixture thereof including one kind or two or more kinds of element(s) selected from Zn, Al, Ga, In, and Sn.

17. The phosphor of item 11, characterized in that the additional crystal phase or amorphous phase is an inorganic phosphor different from the phosphor of any one of items 1 through 10.

18. The phosphor of any one of items 1 through 17, characterized in that the phosphor emits fluorescence having a peak at a wavelength in a range of 570 nm to 700 nm, by irradiation of an excitation source.

19. The phosphor of item 18, characterized in that the excitation source is ultraviolet light or visible light having a wavelength between 100 nm inclusive and 570 nm inclusive, or electron beam or X-rays.

20. A lighting instrument constituted of a light-emitting source and a phosphor, characterized in that at least the phosphor of any one of items 1 through 19 is used as the constituent phosphor.

21. The lighting instrument of item 20, characterized in that the light-emitting source is an LED for emitting light at a wavelength of 330 to 500 nm.

22. The lighting instrument of item 20 or 21, characterized in that the light-emitting source is an LED for emitting light at a wavelength between 330 and 420 nm; and that the constituent phosphor is provided by adopting: the phosphor of any one of items 1 through 19; a blue-aimed phosphor having an emission peak at a wavelength between 420 nm inclusive and 500 nm inclusive by pump light between 330 and 420 nm; and a green-aimed phosphor having an emission peak at a wavelength between 500 nm inclusive and 570 nm inclusive by pump light between 330 and 420 nm; so that the constituent phosphor emits white light mixedly including red light, green light, and blue light.

23. The lighting instrument of item 20 or 21, characterized in that the light-emitting source is an LED for emitting light at a wavelength between 420 and 500 nm; and that the constituent phosphor is provided by adopting: the phosphor of any one of items 1 through 19; and a green-aimed phosphor having an emission peak at a wavelength between 500 nm inclusive and 570 nm inclusive by pump light between 420 and 500 nm; so that the constituent phosphor emits white light.

24. The lighting instrument of item 20 or 21, characterized in that the light-emitting source is an LED for emitting light at a wavelength between 420 and 500 nm; and that the constituent phosphor is provided by adopting: the phosphor of any one of items 1 through 19; and a yellow-aimed phosphor having an emission peak at a wavelength between 550 nm inclusive and 600 nm inclusive by pump light between 420 and 500 nm; so that the constituent phosphor emits white light.

25. The lighting instrument of item 24, characterized in that the yellow-aimed phosphor is Ca-α-sialon including Eu dissolved therein in a solid state.

26. An image displaying apparatus having an excitation source and a constituent phosphor, characterized in that at least the phosphor of any one of items 1 through 19 is used as the constituent phosphor.

27. The image displaying apparatus of item 26, characterized in that the image displaying apparatus is a vacuum fluorescent display (VFD), field emission display (FED), plasma display panel (PDP), or cathode ray tube (CRT).

EFFECT OF THE INVENTION

The phosphors of the present invention each include, as a main component: a multi-component nitride or multi-component oxynitride including a divalent element, a trivalent element, and a tetravalent element; so that the phosphors of the present invention exhibit emission at longer wavelengths than those by conventional sialon phosphors, oxynitride phosphors, and the like, and are excellent as phosphors for emission in orange, red, and the like. Further, the phosphors of the present invention serve as useful ones to be preferably used for VFD, FED, PDP, CRT, white LED, and the like without luminance deterioration even when exposed to excitation sources.

EXPLANATION OF REFERENCE NUMERALS

Figure 1:
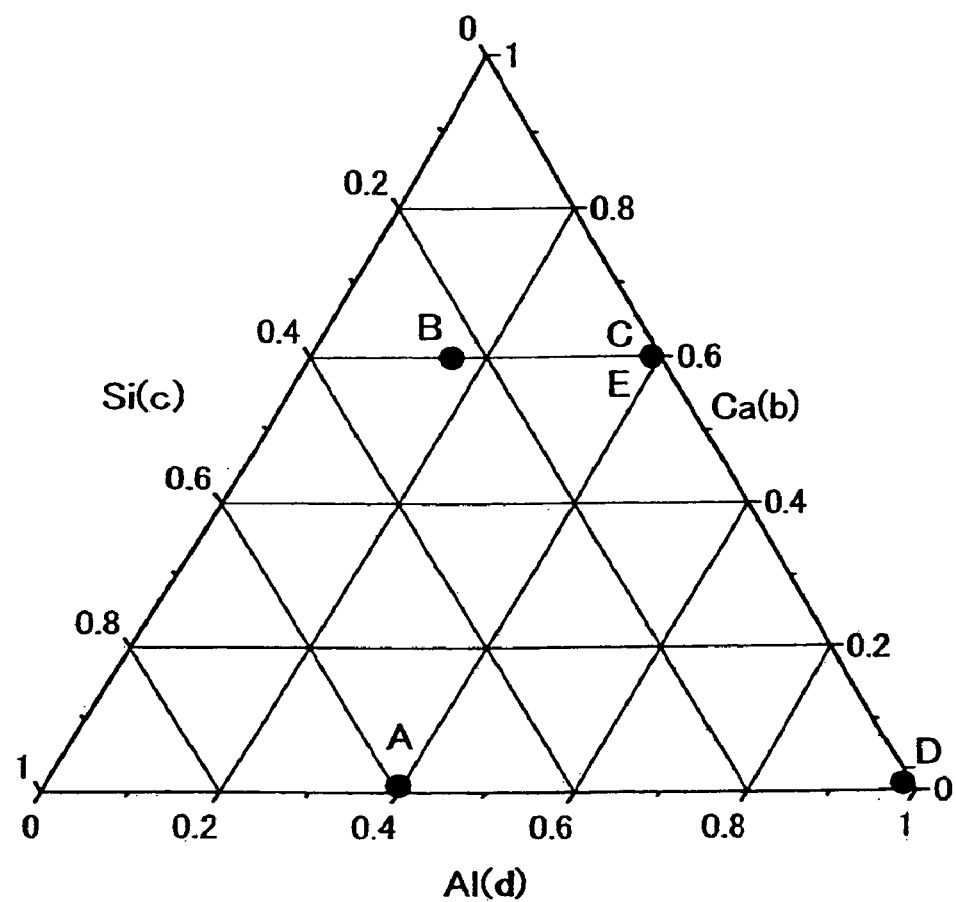
FIG. 1 is a ternary phase diagram showing ranges of parameters b, c, and d in a composition formula $M_a A_b D_c E_d N_e O_f X_g$.

1 mixture of red-aimed phosphor (Example 1) of the present invention and yellow-aimed phosphor, or mixture of red-aimed fluorescent substance (Example 1) of the present invention, blue-aimed fluorescent substance, and green-aimed fluorescent substance
2 LED chip
3, 4 electroconductive terminal
5 wire bond
6 resin layer
7 vessel
8 red-aimed phosphor (Example 1) of the present invention
9 green-aimed phosphor
10 blue-aimed phosphor
11, 12 ultraviolet emission cell
14, 15, 16, electrode
17
18, 19 dielectric layer
20 protection layer
21, 22 glass substrate

BEST MODE FOR CARRYING OUT THE INVENTION

The present invention will be described in detail.

The phosphor of the present invention is a composition including at least an activation element M, a divalent element A, a tetravalent element D, a trivalent element E, nitrogen, oxygen as required, and another element(s) X as required.

Examples of representative constituent elements include: as M, one kind or two or more kinds of element(s) selected from Mn, Ce, Pr, Nd, Sm, Eu, Gd, Tb, Dy, Ho, Er, Tm, Yb, and Lu; as A, one kind or two or more kinds of element(s) selected from Mg, Ca, Sr, and Ba; as D, one kind or two or more kinds of element(s) selected from Si, Ge, and Sn; and, as E, one kind or two or more kinds of element(s) selected from B, Al, Ga, and In.

These constituent elements allow for obtainment of phosphors exhibiting emission in a red color region.

The composition thereof is represented by a composition formula $M_a A_b D_c E_d N_e O_f X_g$.

Composition formula implies a ratio between numbers of atoms constituting the applicable substance, and an equivalent composition is provided by a composition formula where parameters a, b, c, d, e, f, and g are each multiplied by an arbitrary identical value.

Thus, the following conditions are defined by the present invention, for the parameters a, b, c, d, e, f, and g which are re-calculated so that b+c+d=1.

In the present invention, the parameters a, b, c, d, e, f, and g are selected from values satisfying all the following conditions:

$$0.00001 \leq a \leq 0.15 \quad \text{(i)},$$

$$0.01 \leq b \leq 0.6 \quad \text{(ii)},$$

$$2/3 \times c \leq d \quad \text{(iv)},$$

$$0.8 \times (2/3 \times b + 4/3 \times c + d) \leq e + f \quad \text{(v)},$$

$$e + f \leq 1.2 \times (2/3 \times b + 4/3 \times c + d) \quad \text{(vi)},$$

$$0 \leq f/(e+f) \leq 0.4 \quad \text{(vii), and}$$

$$0 \leq g \leq 0.2 \quad \text{(viii)}.$$

The "a" value represents an added amount of the element M as an emission center, and is preferably set between 0.00001 inclusive and 0.15 inclusive.

Values of "a" smaller than 0.00001 lead to smaller numbers of M as the emission center, thereby deteriorating emission luminances.

Values of "a" exceeding 0.15 cause concentration quenching due to interference among M ions, thereby deteriorating luminances.

In case of adopting Eu as the element M, values of "a" between 0.0001 inclusive and 0.02 inclusive allow for obtainment of phosphors having particularly higher luminances.

The "b" value represents a content of the divalent element A such as Ca, the "c" value represents a content of the tetravalent element D such as Si, the "d" value represents a content of the trivalent element E such as Al, and the parameters b, c, and d largely affect the optical characteristics.

These parameters have values within the following ranges:

$$0.01 \leq b \leq 0.6,$$

$$0.01 \leq c, \text{ and}$$

$$2/3 \times c \leq d.$$

These ranges cover values of points P (d, b, c) on sides of or inside a quadrilateral enclosed by lines connecting between an A point (0.396, 0.01, 0.594), a B point (0.16, 0.6, 0.24), a C point (0.39, 0.6, 0.01), and a D point (0.98, 0.01, 0.01) on the triangular graph representation having parameters d, b, and c shown in FIG. 1. Luminances of red light emission are high, in the compositions having ratios between the A element, D element, and E element represented by these ranges.

Within the composition ranges, emission luminances are particularly high in a composition where the parameters c and d are selected from values satisfying the following equation, i.e., in a composition where a ratio between the D element and E element is about 1:

$$0.9 \times c \leq d \leq 1.1 \times c$$

When the D element is Si and the E element is Al, the composition of c=d is desirable by virtue of much higher luminance.

Within the composition ranges, it is possible to select values where the parameter d is within the following range:

$$0.396 \leq d \leq 0.98.$$

These ranges cover values of points on sides of or inside a triangle enclosed by lines connecting between the A point (0.396, 0.01, 0.594), the D point (0.98, 0.01, 0.01), and an E point (0.396, 0.594, 0.01) on the triangular graph representation shown in FIG. 1.

Particularly, within the composition ranges satisfying these conditions in case of adopting Ca as the A element, Si as the D element, and Al as the E element, absorption of visible light at 530 nm to 570 nm is less, and ultraviolet light, blue light and the like are selectively absorbed by the phosphor of the present invention.

As such, it becomes possible to take out light-beams emitted from a yellow-aimed phosphor, a green-aimed phosphor, and another phosphor at higher efficiencies, when the phosphor of the present invention is used by mixing it with the yellow-aimed phosphor, green-aimed phosphor, and other phosphor.

The "e" value represents a content of nitrogen, and the "f" value represents a content of oxygen, in a manner that the value of e+f is between $0.8 \times (2/3 \times b + 4/3 \times c + d)$ inclusive and $1.2 \times (2/3 \times b + 4/3 \times c + d)$ inclusive.

Further, the ratio between e and f is preferably within the following range:

$$0 \leq f/(e+f) \leq 0.4.$$

Preferably, the following range is desirable:

$$0 \leq f/(e+f) \leq 0.2.$$

Values of e and f outside this range lead to deteriorated emission luminances.

The "g" value represents a content of the element X other than the activation element M, divalent element A, trivalent element E, tetravalent element D, nitrogen, and oxygen. Examples of the element X include: a monovalent metallic element such as Li or Na; a pentavalent or higher valent metallic element such as V or W; impurity elements in starting materials; and fluorine included in a flux for grain growth.

Although the element X may be added in the following range insofar as optical characteristics of the phosphor are not deteriorated:

$$0 \leq g \leq 0.2$$

smaller amounts are desirable.

Among the above compositions, those compositions exhibiting higher emission luminances include Eu as the M element, Ca or Ca and Sr as the A element, Si as the D element, Al as the E element, and N as the X element.

Among them, those inorganic compounds are applicable having compositions where the M element is Eu, the A element is Ca or a combination of Ca and Sr, the D element is Si, and the E element is Al.

Among the above compositions, those inorganic compounds, which are $CaAlSiN_3$ crystals including M dissolved therein in a solid state, or $(Ca, Sr)AlSiN_3$ crystals including M dissolved therein in a solid state, are established into phosphors having particularly higher luminances, respectively.

Within the above composition ranges, those inorganic compounds including, as host materials: $(Ca, Sr)AlSiN_3$ crystals which are crystals where a part of Ca is substituted by Sr; or a solid solution of the crystal; are established into phosphors which emit light at wavelengths shorter than those phosphors including, as host materials, $CaAlSiN_3$ crystals.

In case of utilizing the phosphor of the present invention as a powder, averaged particle sizes between 0.1 µm inclusive and 20 µm inclusive are desirable, from standpoints of dispersibility into resin, flowability of the powder, and the like. Additionally, making the powder as single crystal particles in this range, further improves emission luminance.

To obtain a phosphor having a higher emission luminance, it is desirable to extremely decrease impurities included in the applicable inorganic compound. Particularly, since light emission is obstructed by inclusion of large amounts of Fe, Co, Ni impurity elements, it is desirable to control selecting and synthesizing processes for starting material powders such that the total amount of these impurity elements is limited to 500 ppm or less.

In the present invention, although the $M_a A_b D_c E_d N_e O_f X_g$ compositions acting as constituent components of the nitrides are to be highly pure and to be included as much as possible, and are to be possibly and desirably constituted of a single phase from a standpoint of fluorescence emission, it is also possible to constitute the composition by a mixture with an additional crystal phase or amorphous phase within an extent where due properties are not deteriorated.

In this case, it is desirable that the content of $M_a A_b D_c E_d N_e O_f X_g$ composition is 5 mass % or more, so as to obtain higher luminance. More preferably, luminance is remarkably improved by 50 mass % or more.

For the range of the main component in the present invention, the content of the $M_a A_b D_c E_d N_e O_f X_g$ composition is at least 5 mass % or more. The content of the $M_a A_b D_c E_d N_e O_f X_g$ composition can be obtained by multi-phase analysis based on a Rietveld method while conducting X-ray diffractometry.

Expediently, it is possible to obtain the content of the $M_aA_bD_cE_dN_eO_fX_g$ composition from a ratio of maximum line height thereof to those of other crystals by using an X-ray diffractometry result.

In the present invention, compositions may be selected in the system including Al, to provide a mixture of the $M_aA_bD_cE_dN_eO_fX_g$ composition crystal with AlN or a polytype crystal of AlN.

Particularly, mixtures of the composition crystal with a $CaAlSiN_3$ crystal or (Ca, Sr)$AlSiN_3$ crystal, and with AlN or a polytype crystal of AlN, simultaneously have higher luminances and chemical stabilities, respectively.

In the present invention, compositions may be selected in the system including Si, to provide a mixture of the $M_aA_bD_cE_dN_eO_fX_g$ composition crystal with $\beta$-$Si_3N_4$, $\beta$-sialon, or $\alpha$-sialon.

Particularly, mixtures of the composition crystal with a $CaAlSiN_3$ crystal or (Ca, Sr)$AlSiN_3$ crystal, and with $\beta$-$Si_3N_4$, $\beta$-sialon, or $\alpha$-sialon, simultaneously have higher luminances and chemical stabilities, respectively.

In the present invention, compositions may be selected in the system including Ca, to provide a mixture of the $M_aA_b$-$D_cE_dN_eO_fX_g$ composition crystal with $CaSiN_2$, $Ca_2Si_5N_8$, or $CaSiN_2$, $Ca_2Si_5Na$ where a part of Ca is substituted by Sr.

Particularly, mixtures of the composition crystal with a $CaAlSiN_3$ crystal or (Ca, Sr)$AlSiN_3$ crystal, and with $CaSiN_2$, $Ca_2Si_5N_8$, or $CaSiN_2$, $Ca_2Si_5N_8$ where a part of Ca is substituted by Sr, emit red light at excellent color purities.

When the phosphor of the present invention is used for application where the same is excited by electron beam, it is possible to provide the phosphor with electroconductivity by mixing an inorganic substance having electroconductivity with the phosphor. Examples of inorganic substances having electroconductivity include oxides, oxynitrides, nitrides, and mixtures thereof each including one kind or two or more kinds of element(s) selected from Zn, Al, Ga, In, and Sn.

Although the phosphors of the present invention emit red light, it is possible to mix inorganic phosphors therewith which emit other color(s) such as yellow, green, blue, and the like as required, when the red color is required to be mixed with such other color(s).

The phosphors of the present invention are different in excitation spectra and fluorescence spectra depending on compositions, and appropriate selections and combinations of compositions enable phosphors established to have various fluorescence spectra, respectively. Formulations may be set in conformity to necessary spectra based on applicable usages, respectively. Among them, those compositions including Eu as the M element, Ca or Sr, or a combination thereof as the A element, Si as the D element, and Al as the E element exhibit emission having peaks at wavelengths in a range between 600 nm inclusive and 700 nm inclusive when excited by light at wavelengths in a range between 200 nm inclusive and 600 nm inclusive, thereby exhibiting excellent emission characteristics as red-aimed phosphors.

As compared with ordinary oxide phosphors or existing sialon phosphors, the phosphors of the present invention to be obtained in the above manner are characterized in that: the present phosphors have wider excitation ranges from electron beam and X-rays to ultraviolet light and visible light; that the phosphors exhibit orange or red light emission at 570 nm or longer; and that the phosphors of specific compositions exhibit red light from 600 nm to 700 nm; in a manner to exhibit red light emission in a color range where $0.45 \leq x \leq 0.7$ in terms of (x, y) values on CIE chromaticity coordinates.

Based on the above emission characteristics, the phosphors are desirable for a lighting instrument and an image displaying apparatus. Additionally, the phosphors are excellent in heat resistance since the same are never deteriorated even when exposed to high temperatures, and the phosphors are also excellent in long-term stability in an oxidative atmosphere and a moisture environment.

Although the phosphors of the present invention are not defined in production method, it is possible to produce the phosphors having higher luminance by the following methods.

It is possible to obtain a higher luminance phosphor by firing, in an inert atmosphere containing nitrogen at a temperature range from 1,200° C. inclusive and 2,200° C. inclusive, a starting material mixture or metallic compound mixture which is capable of constituting a composition represented by M, A, D, E, N, O, and X when fired.

In case of synthesizing a phosphor containing Eu, Ca, Si, Al, N, and O, it is desirable to adopt, as starting materials, a powdery mixture of europium nitride or europium oxide, calcium nitride, silicon nitride, and aluminum nitride. These nitride starting materials usually contain oxygen as impurities serving as oxygen sources.

Further, in case of synthesizing compositions containing strontium, addition of strontium nitride in addition to the above formulation provides an inorganic compound where a part of calcium atom in the crystal is substituted by strontium, thereby allowing for obtainment of a phosphor exhibiting a higher luminance.

The mixed powder of metallic compounds is desirably fired in a state where the same is held at a filling ratio exhibiting a bulk density of 40% or less. The bulk density is a volumetric filling ratio of a powder. Suitable as the container is a boron nitride sintered body, since it exhibits a lower reactivity with the metallic compounds.

The reason, why the starting material powder is to be fired in the state where its bulk density is held at 40% or less, is as follows. Namely, firing the powder in a state where free spaces are left around the powder, causes the crystals of reaction products to grow into the free spaces with less contact among the crystals, thereby enabling synthesis of a crystal having fewer surface defects.

Next, the thus obtained metallic compound mixture is fired at a temperature range between 1,200° C. inclusive and 2,200° C. inclusive in an inert atmosphere containing nitrogen, thereby synthesizing a phosphor. Since the firing temperature is high and the firing environment is an inert atmosphere containing nitrogen, the furnace to be used for firing is preferably an electric one in a metal resistance heating type or black lead resistance heating type which utilizes carbon as a material for the hot portion of the furnace. The firing procedure is preferably a sintering procedure such as an ordinary pressure sintering method or a gas pressure sintering method where no mechanical pressurization is applied from the exterior, so as to conduct firing while keeping the bulk density high.

When the powder aggregation obtained by firing is firmly solidified, the same is to be pulverized by a pulverizer such as a ball mill, jet mill, or the like to be commonly used in factories. The pulverization is to be conducted until the averaged particle size becomes 20 μm or less. Particularly desirably, the averaged particle size is between 0.1 μm inclusive and 5 μm inclusive. Averaged particle sizes exceeding 20 μm lead to a deteriorated flowability of the powder and deteriorated dispersibility thereof in the resin, and lead to non-uniform emission intensities site by site upon fabricating a light emitting apparatus by combination with a light emitting element. Averaged particle sizes of 0.1 μm or less lead to a large number of defects at the surface of the phosphor powder, thereby deteriorating emission intensities depending on compositions of the phosphors.

As described above, the phosphors of the present invention each exhibit higher luminances than the conventional sialon phosphors, and are each less in luminance deterioration of the phosphor when exposed to an excitation source, so that the phosphors of the present invention are suitably utilized for VFD, FED, PDP, CRT, white LED, and the like.

The lighting instrument of the present invention is constituted of at least a light-emitting source and the phosphor of the present invention. Examples of the lighting instruments include an LED lighting instrument, a fluorescent lamp, and the like. LED lighting instruments can be produced by utilizing the phosphors of the present invention, based on the known methods such as described in JP-A-5-152609, JP-A-7-99345, JP-2927279, and the like. In this case, desirable examples of light-emitting sources include ones for emitting light at wavelengths of 330 to 500 nm, and particularly, ultraviolet (or violet) LED light emitting elements for 330 to 420 nm, or blue LED light emitting elements for 420 to 500 nm.

Such light emitting elements include ones comprising nitride semiconductor such as GaN, InGaN, or the like, which can be made into light-emitting sources for emitting light at predetermined wavelengths by composition adjustment.

In addition to the way to solely adopt the phosphor of the present invention in a lighting instrument, it is possible to constitute a lighting instrument for emitting light in a desired color by combiningly using a phosphor having another emission characteristic. Examples thereof include a combination of: an ultraviolet LED light emitting element of 330 to 420 nm; a blue-aimed phosphor to be excited at the above-mentioned wavelength to thereby have an emission peak at a wavelength between 420 nm inclusive and 480 nm inclusive; a green-aimed phosphor to be similarly excited to thereby have an emission peak at a wavelength between 500 nm inclusive and 550 nm inclusive; and the phosphor of the present invention. Examples of such blue-aimed phosphors include $BaMgAl_{10}O_{17}$:Eu, and examples of such green-aimed phosphors include $BaMgAl_{10}O_{17}$:Eu,Mn. In this configuration, ultraviolet rays emitted by the LED are irradiated to the phosphors which then emit light in three colors of red, blue, and green, thereby establishing a lighting instrument for emitting white light mixedly including these light.

Another way includes a combination of: a blue LED light emitting element of 420 to 500 nm; a yellow-aimed phosphor to be excited at the above-mentioned wavelength to thereby have an emission peak at a wavelength between 550 nm inclusive and 600 nm inclusive; and the phosphor of the present invention. Examples of such yellow-aimed phosphors include $(Y, Gd)_2(Al, Ga)_5O_{12}$:Ce described in JP-2927279, α-sialon:Eu described in JP-A-2002-363554, and the like. Among them, Ca-α-sialon including Eu dissolved therein in a solid state is preferable by virtue of a higher emission luminance. In this configuration, blue light emitted by the LED is irradiated to the phosphors which then emit light in two colors of red and yellow, which light is mixed with the blue light by the LED itself, thereby establishing a lighting instrument for emitting light in white or reddish incandescent color.

Still another way includes a combination of: a blue LED light emitting element of 420 to 500 nm; a green-aimed phosphor to be excited at the above-mentioned wavelength to thereby have an emission peak at a wavelength between 500 nm inclusive and 570 nm inclusive; and the phosphor of the present invention. Examples of such green-aimed phosphors include $Y_2Al_5O_{12}$:Ce. In this configuration, blue light emitted by the LED is irradiated to the phosphors which then emit light in two colors of red and green, which light is mixed with the blue light by the LED itself, thereby establishing a lighting instrument for emitting white light.

The image displaying apparatus of the present invention is constituted of at least an excitation source and the phosphor of the present invention, and examples thereof include a vacuum fluorescent display (VFD), field emission display (FED), plasma display panel (PDP), cathode ray tube (CRT), and the like. It has been confirmed that the phosphors of the present invention can each emit light by excitation of vacuum ultraviolet light from 100 to 190 nm, ultraviolet light from 190 to 380 nm, electron beam and the like, and combining such an excitation source with the phosphor of the present invention enables establishment of such an image displaying apparatus as described above.

EXAMPLES

Although the present invention will be detailedly described based on the following Examples, these Examples are merely disclosed to aid in readily understanding the present invention, without limiting the present invention thereto.

Example 1

Used for preparation of a starting material powder were: a silicon nitride powder having an averaged particle size of 0.5 μm, an oxygen content of 0.93 wt %, and an α-type content of 92%; an aluminum nitride powder having a specific surface area of 3.3 $m^2$/g, and an oxygen content of 0.79%; a calcium nitride powder; and europium nitride synthesized by nitriding metal europium in ammonia.

Composition Formula:

To obtain a compound represented by a composition formula $Eu_{0.002674}Ca_{0.331551}Al_{0.334225}Si_{0.334225}N_{1.002674}$ (Table 1 shows parameters of a designed composition, and Table 2 shows a mixture composition of starting material powders), there were weighed 33.858 wt %, 29.681 wt %, 35.499 wt %, and 0.961 wt % of a silicon nitride powder, an aluminum nitride powder, a calcium nitride powder, and a europium nitride powder; the powders were then mutually mixed for 30 minutes by an agate pestle and an agate mortar, and thereafter, the obtained mixture was naturally dropped into a crucible made of boron nitride through a sieve of 500 μm, thereby filling the powder into the crucible.

The powder had a bulk density of about 25%. Note that operations of all the weighing, mixing, and shaping procedures of the powders were conducted within a glove box capable of maintaining a nitrogen atmosphere including a moisture of 1 ppm or less and oxygen of 1 ppm or less.

The mixed powder was introduced in the crucible made of boron nitride, which was then set in an electric furnace of a black lead resistance heating type. There was conducted a firing operation by firstly bringing the firing environment to vacuum by a diffusion pump, heating from a room temperature up to 800° C. at a rate of 500° C./hour, introducing nitrogen at a purity of 99.999 vol % at 800° C. to achieve a pressure of 1 MPa, elevating the temperature to 1,800° C. at a rate of 500° C./hour, and holding for 2 hours at 1,800° C.

After firing, the obtained fired body was roughly pulverized, and then manually pulverized by a crucible and a mortar both made of silicon nitride sintered body, followed by passage through a sieve of 30 μm mesh. Measurement of particle size distribution showed an averaged particle size of 15 μm.

Figure 2:
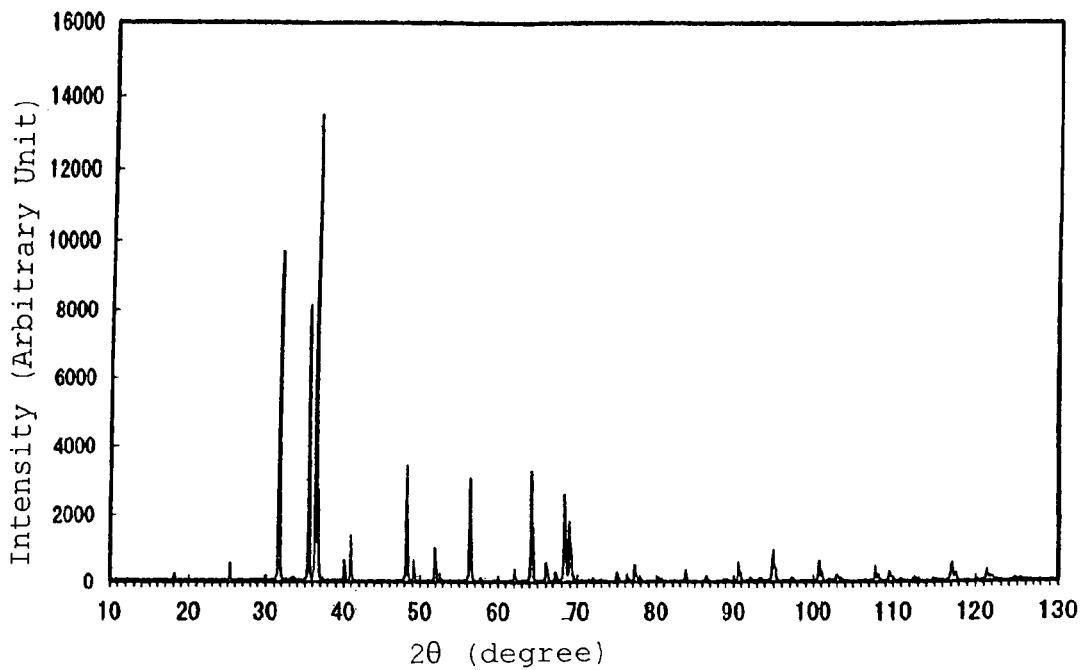
FIG. 2 is an X-ray diffractometry chart of a phosphor (Example 1).

Next, the synthesized compound was pulverized by an agate mortar, and there was conducted a powder X-ray diffraction measurement by Kα line of Cu. The resultingly obtained chart is shown in FIG. 2, and phases other than a CaAlSiN$_3$ crystal were not detected.

Composition analysis of this powder was conducted in the following manner. Firstly, 50 mg of specimen was charged into a platinum crucible, followed by heat melting with addition of 0.5 g of sodium carbonate and 0.2 g of boric acid, and the melt was dissolved in 2 ml of hydrochloric acid to prepare a measurement solution of a constant volume of 100 ml. This liquid specimen was subjected to ICP emission spectroscopic analysis, to quantify Si, Al, Eu, and Ca.

Further, 20 mg of the specimen was charged into a tin capsule which was then introduced into a nickel basket, followed by quantification of oxygen and nitrogen in the powder specimen by a TC-436 type oxygen/nitrogen analyzer manufactured by LECO Corp. The measurement result showed Eu: 0.86±0.01 mass %, Ca: 28.9±0.1 mass %, Si: 20.4±0.1 mass %, Al: 19.6±0.1 mass %, N: 28.3±0.2 mass %, and O: 2.0±0.1 mass %.

This was particularly high in oxygen content, as compared with the designed composition shown in Table 1. This was due to impurity oxygen included in the silicon nitride, aluminum nitride, and calcium nitride used as the starting materials. Based on the measured composition, the ratio N/(O+N) between the numbers of N and O was equal to 0.942. The composition of the synthesized inorganic compound calculated from the analysis result of all the elements was $Eu_{0.002607}Ca_{0.331673}Si_{0.33418}Al_{0.334147}N_{0.929968}O_{0.057496}$.

Figure 3:
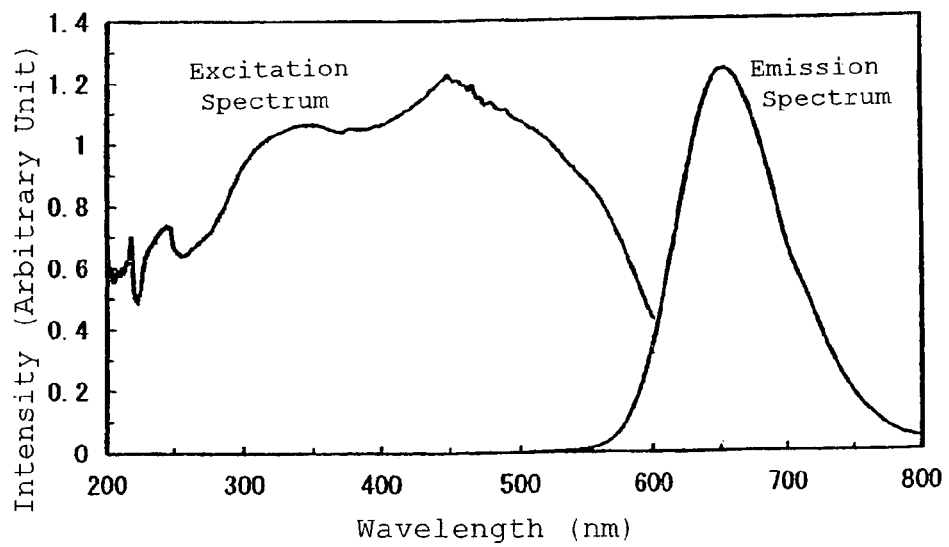
FIG. 3 is a graph showing an emission spectrum and an excitation spectrum of the phosphor (Example 1).

This powder was irradiated by a lamp emitting light at a wavelength of 365 nm, thereby confirming that the powder emitted red light. The powder was measured by a spectrophotofluorometer to provide an emission spectrum and an excitation spectrum (FIG. 3), thereby resultingly showing that the powder was a phosphor having a peak at 449 nm in the excitation spectrum, and a peak at red light of 653 nm in the emission spectrum based on the excitation of 449 nm.

The emission intensity at the peak was 1.305 count. Note that the count value has an arbitrary unit, since it varies depending on a measurement device, a measurement condition, and the like. In the present invention, the count value is indicated by standardization such that the emission intensity of a commercially available YAG:Ce phosphor (P46Y3: produced by KASEI OPTONIX, LTD.) becomes 1. Further, the CIE chromaticity obtained from the emission spectrum based on the excitation of 449 nm was red where x=0.6699 and y=0.3263.

Example 2

Used as starting materials were the same aluminum nitride powder, the same calcium nitride powder, and the same europium nitride synthesized by nitriding metal europium in ammonia, as Example 1.

Composition Formula:

To obtain a compound represented by a composition formula $Eu_{0.001993}Ca_{0.182642}Al_{0.628737}Si_{0.182642}N_{1.003986}$ (Table 1 shows parameters of a designed composition, and Table 2 shows a mixture composition of starting material powders), there were weighed 20.068 wt %, 58.641 wt %, 20.54 wt %, and 0.75 wt % of a silicon nitride powder; an aluminum nitride powder, a calcium nitride powder, and a europium nitride powder; to synthesize an inorganic compound by the same process as Example 1.

Figure 4:
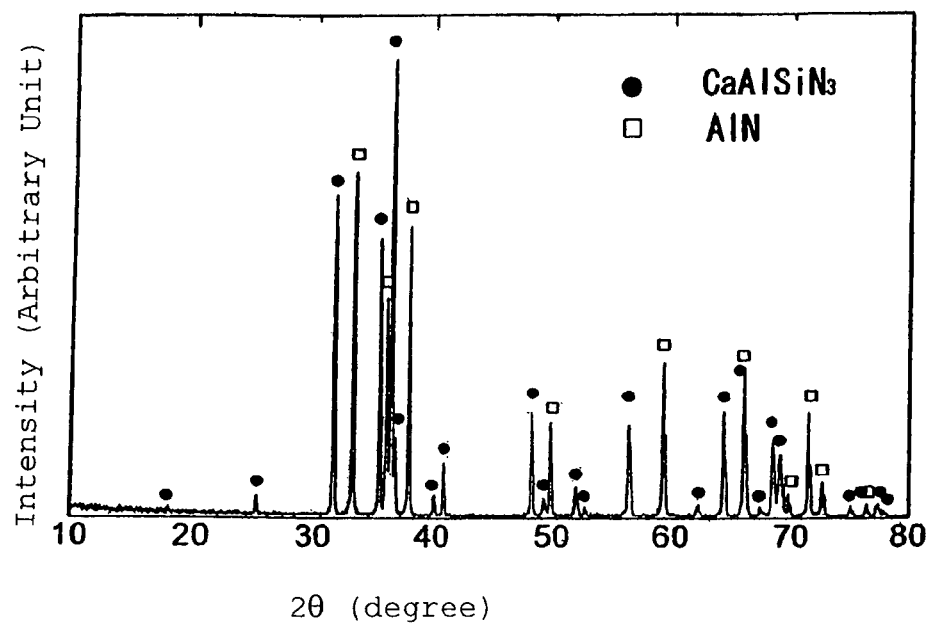
FIG. 4 is an X-ray diffractometry chart of a phosphor (Example 2).

Next, the synthesized compound was pulverized by an agate mortar, and there was conducted a powder X-ray diffraction measurement by Kα line of Cu. The resultingly obtained chart is shown in FIG. 4, and phases other than a mixture of CaAlSiN$_3$ crystal and AlN crystal were not detected. In the X-ray diffractometry, the ratio ($I_c/I_a$) of a maximum line height $I_c$ of CaAlSiN$_3$ crystal to a maximum line height $I_a$ of AlN crystal was 1.34, showing that the content ratio of CaAlSiN$_3$ was 57%.

Figure 5:
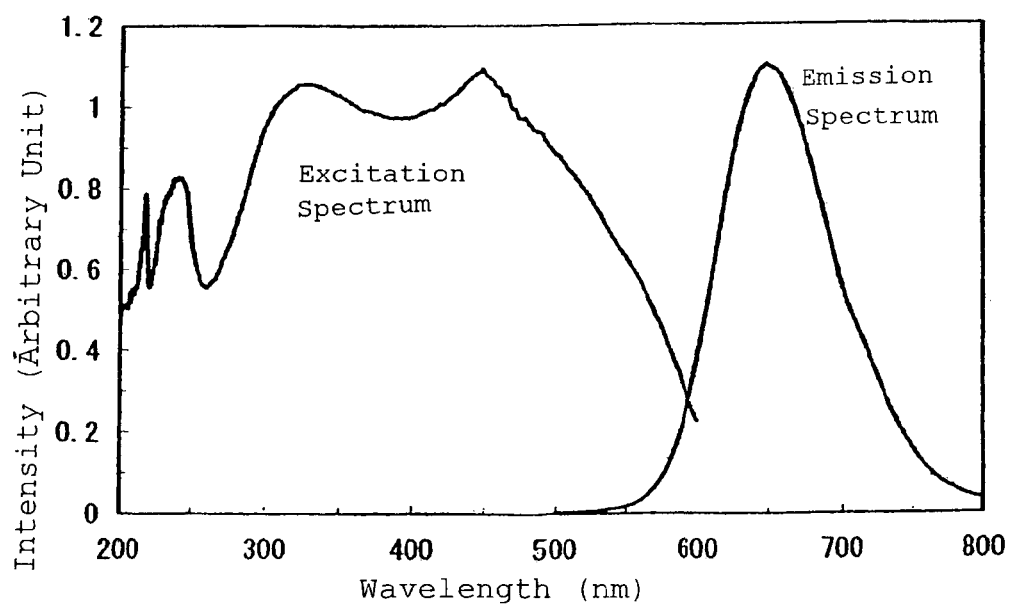
FIG. 5 is a graph showing an emission spectrum and an excitation spectrum of the phosphor (Example 2).

This powder was irradiated by a lamp emitting light at a wavelength of 365 nm, thereby confirming that the powder emitted red light. The powder was measured by a spectrophotofluorometer to provide an emission spectrum and an excitation spectrum (FIG. 5), thereby resultingly showing that the powder was a phosphor having a peak at 449 nm in the excitation spectrum, and a peak at red light of 649 nm in the emission spectrum based on the excitation of 449 nm. Table 3 shows a peak wavelength of excitation spectrum, and a peak wavelength and a peak emission intensity of emission spectrum. The peak emission intensity was 1.099.

Since the excitation spectrum of this powder has a feature that it has a smaller amount of absorption in a wavelength range of 500 nm to 600 nm as compared with Example 1, thereby exhibiting an advantage that a combination of this phosphor with another green-aimed phosphor or yellow-aimed phosphor leads to a smaller amount of absorption of light emitted by the other phosphor.

Examples 3 to 43

Inorganic compounds were prepared by the same procedure as Example 1, except for compositions listed in Table 1 and Table 2. The synthesized inorganic compounds were measured for excitation spectra and emission spectra, thereby showing that the inorganic compounds were red-aimed phosphors which were excited by ultraviolet light or visible light at 350 nm to 600 nm and had emission peaks in a range of 570 nm to 700 nm as shown in Table 3, respectively.

Figure 6:
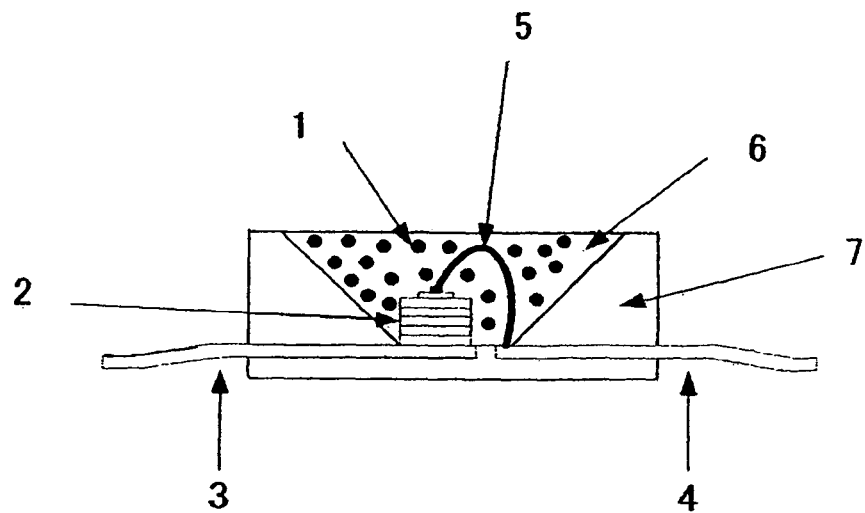
FIG. 6 is a schematic view of a lighting instrument (LED lighting instrument) according to the present invention.

There will be now explained lighting instruments each adopting the phosphor comprising the nitride of the present invention. FIG. 6 is a schematic view of a structure of a white LED as a lighting instrument. The lighting instrument adopts a blue LED 2 of 450 nm as a light emitting element, and has a structure that the blue LED 2 is covered by a resin layer including, dispersed therein, the phosphor of Example 1 of the present invention, and a yellow-aimed phosphor of Ca-α-sialon:Eu having a composition of $Ca_{0.75}Eu_{0.25}Si_{8.625}Al_{3.375}O_{1.125}N_{14.875}$.

Flowing an electric current through electroconductive terminals of the LED 2 caused it to emit light at 450 nm, which excited the yellow-aimed phosphor and red-aimed phosphor to cause them to emit yellow light and red light, respectively, to function as a lighting instrument for emitting incandescent color light mixedly including the LED light, yellow light, and red light.

There will be described a lighting apparatus prepared based on another composition different from the above. Firstly, this had a structure including: an ultraviolet LED of 380 nm as a light emitting element; and a phosphor dispersion resin layer covered on the ultraviolet LED, the resin layer being provided by dispersing, in a layer of resin, the phosphor of Example 1 of the present invention, a blue-aimed phosphor ($BaMgAl_{10}O_{17}$:Eu), and a green-aimed phosphor ($BaMgAl_{10}O_{17}$:Eu, Mn). Flowing an electric current through electro conductive terminals of the LED caused it to emit light at 380 nm, which excited the red-aimed phosphor, green-aimed phosphor, and blue-aimed phosphor to cause them to emit red light, green light, and blue light, respectively. It functioned as a lighting instrument for emitting white light mixedly including this light.

There will be described a lighting apparatus prepared based on another composition different from the above. Firstly, this had a structure including: a blue LED of 450 nm as a light emitting element; and a phosphor dispersion resin layer covered on the blue LED, the resin layer being provided by dispersing, in a layer of resin, the phosphor of Example 1 of the present invention, and a green-aimed phosphor (BaMgAl$_{10}$O$_{17}$:Eu, Mn). Flowing an electric current through electroconductive terminals of the LED caused it to emit light at 450 nm, which excited the red-aimed phosphor, and green-aimed phosphor to cause them to emit red light and green light, respectively. It functioned as a lighting instrument for emitting white light mixedly including the blue light of LED, green light, and red light.

Figure 7:
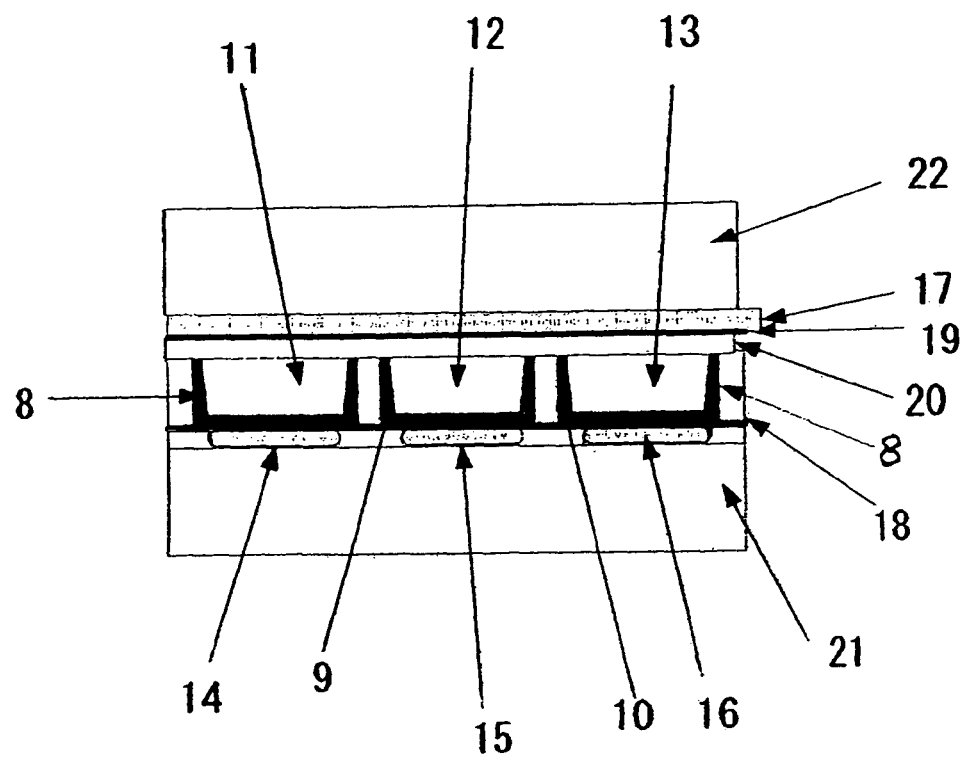
FIG. 7 is a schematic view of an image displaying apparatus (plasma display panel) according to the present invention.

There will be explained an exemplary design of an image displaying apparatus adopting the phosphor of the present invention. FIG. 7 is a principle schematic view of a plasma display panel as an image displaying apparatus. The apparatus includes cells 11, 12, and 13 having inner surfaces coated with the red-aimed phosphor of Example 1 of the present invention, a green-aimed phosphor (Zn$_2$SiO$_4$:Mn) and a blue-aimed phosphor (BaMgAl$_{10}$O$_{17}$:Eu), respectively. Flow of electric current through electrodes 14, 15, 16, and generates vacuum ultraviolet light by Xe discharge within the cells, to thereby excite the phosphors in a manner to emit visible light of red, green, and blue, respectively, so that these light are observed from the exterior through a protection layer 20, a dielectric layer 19, and a glass substrate 22, and thus the panel is capable of functioning as an image displaying apparatus.

TABLE 1

| Example | Eu a | Ca b | Si c | Al d | N e | O f | X g |
|---|---|---|---|---|---|---|---|
| 1 | 0.002674 | 0.331551 | 0.334225 | 0.334225 | 1.002674 | 0 | 0 |
| 2 | 0.001993 | 0.182642 | 0.188621 | 0.628737 | 1.003986 | 0 | 0 |
| 3 | 0.000667 | 0.332889 | 0.333556 | 0.333556 | 1.000667 | 0 | 0 |
| 4 | 0.001335 | 0.332443 | 0.333778 | 0.333778 | 1.001335 | 0 | 0 |
| 5 | 0.003344 | 0.331104 | 0.334448 | 0.334448 | 1.003344 | 0 | 0 |
| 6 | 0.020408 | 0.319728 | 0.340146 | 0.340136 | 1.020408 | 0 | 0 |
| 7 | 0.002674 | 0.331551 | 0.334225 | 0.334225 | 1.002674 | 0 | 0 |
| 8 | 0.002674 | 0.247995 | 0.250668 | 0.501337 | 1.002674 | 0 | 0 |
| 9 | 0.002674 | 0.197861 | 0.250668 | 0.601604 | 1.002674 | 0 | 0 |
| 10 | 0.002674 | 0.164439 | 0.167112 | 0.668449 | 1.002674 | 0 | 0 |
| 11 | 0.002674 | 0.140565 | 0.143239 | 0.716196 | 1.002674 | 0 | 0 |
| 12 | 0.002674 | 0.12266 | 0.125334 | 0.752005 | 1.002674 | 0 | 0 |
| 13 | 0.002674 | 0.197861 | 0.40107 | 0.40107 | 1.069519 | 0 | 0 |
| 14 | 0.002674 | 0.164439 | 0.334225 | 0.501337 | 1.058378 | 0 | 0 |
| 15 | 0.002674 | 0.140565 | 0.286478 | 0.572956 | 1.05042 | 0 | 0 |
| 16 | 0.002674 | 0.12266 | 0.250668 | 0.626671 | 1.044452 | 0 | 0 |
| 17 | 0.002674 | 0.108734 | 0.222816 | 0.668449 | 1.03981 | 0 | 0 |
| 18 | 0.002674 | 0.164439 | 0.501337 | 0.334225 | 1.114973 | 0 | 0 |
| 19 | 0.002674 | 0.140565 | 0.429717 | 0.429717 | 1.099058 | 0 | 0 |
| 20 | 0.002674 | 0.498663 | 0.250668 | 0.250668 | 0.920009 | 0 | 0 |
| 21 | 0.002674 | 0.59893 | 0.200535 | 0.200535 | 0.869875 | 0 | 0 |
| 22 | 0.002674 | 0.398396 | 0.200535 | 0.40107 | 0.93672 | 0 | 0 |
| 23 | 0.002674 | 0.498663 | 0.167112 | 0.334225 | 0.892157 | 0 | 0 |
| 24 | 0.002674 | 0.427044 | 0.286478 | 0.286478 | 0.955819 | 0 | 0 |
| 25 | 0.002674 | 0.283804 | 0.429717 | 0.286478 | 1.051311 | 0 | 0 |
| 26 | 0.002674 | 0.373329 | 0.376003 | 0.250668 | 1.003565 | 0 | 0 |
| 27 | 0.002674 | 0.331551 | 0.167112 | 0.501337 | 0.947861 | 0 | 0 |
| 28 | 0.002674 | 0.427044 | 0.143239 | 0.429717 | 0.908072 | 0 | 0 |
| 29 | 0.002674 | 0.283804 | 0.286478 | 0.429717 | 1.003565 | 0 | 0 |
| 30 | 0.002674 | 0.373329 | 0.250668 | 0.376003 | 0.961787 | 0 | 0 |
| 31 | 0.002674 | 0.247995 | 0.376003 | 0.376003 | 1.045343 | 0 | 0 |
| 32 | 0.002088 | 0.022214 | 0.028479 | 0.949307 | 1.004177 | 0 | 0 |
| 33 | 0.002096 | 0.025157 | 0.031447 | 0.943396 | 1.004193 | 0 | 0 |
| 34 | 0.002039 | 0.033599 | 0.039715 | 0.926686 | 1.004077 | 0 | 0 |
| 35 | 0.001976 | 0.047961 | 0.053889 | 0.89815 | 1.003952 | 0 | 0 |
| 36 | 0.001995 | 0.077847 | 0.083832 | 0.838321 | 1.00399 | 0 | 0 |
| 37 | 0.001993 | 0.182642 | 0.188621 | 0.628737 | 1.003986 | 0 | 0 |
| 38 | 0.006192 | 0.021631 | 0.040207 | 0.938162 | 1.012384 | 0 | 0 |
| 39 | 0.005999 | 0.036539 | 0.054536 | 0.908926 | 1.011998 | 0 | 0 |
| 40 | 0.006058 | 0.066673 | 0.084848 | 0.848479 | 1.012116 | 0 | 0 |
| 41 | 0.006052 | 0.172749 | 0.190904 | 0.636347 | 1.012103 | 0 | 0 |
| 42 | 0.021088 | 0.025341 | 0.088605 | 0.886054 | 1.042176 | 0 | 0 |
| 43 | 0.021065 | 0.136155 | 0.199349 | 0.664496 | 1.042129 | 0 | 0 |

TABLE 2

Starting material mixture composition (mass %)

| Example | Si$_3$N$_4$ | AlN | Ca$_3$N$_2$ | EuN |
|---|---|---|---|---|
| 1 | 33.858 | 29.681 | 35.499 | 0.961 |
| 2 | 20.068 | 58.641 | 20.540 | 0.750 |
| 3 | 34.030 | 29.832 | 35.896 | 0.240 |
| 4 | 33.972 | 29.782 | 35.763 | 0.482 |
| 5 | 33.801 | 29.631 | 35.368 | 1.200 |
| 6 | 32.434 | 28.434 | 32.224 | 6.908 |
| 7 | 33.858 | 29.681 | 35.499 | 0.961 |
| 8 | 26.063 | 45.697 | 27.253 | 0.987 |
| 9 | 21.186 | 55.718 | 22.094 | 1.003 |
| 10 | 17.846 | 62.580 | 18.561 | 1.014 |
| 11 | 15.416 | 67.573 | 15.990 | 1.021 |
| 12 | 13.569 | 71.369 | 14.035 | 1.027 |
| 13 | 41.293 | 36.199 | 21.531 | 0.977 |
| 14 | 34.924 | 45.924 | 18.161 | 0.992 |
| 15 | 30.257 | 53.049 | 15.691 | 1.002 |
| 16 | 26.690 | 58.495 | 13.804 | 1.011 |
| 17 | 23.876 | 62.792 | 12.315 | 1.017 |
| 18 | 51.135 | 29.880 | 18.015 | 0.970 |

TABLE 2-continued

Starting material mixture composition (mass %)

| Example | Si₃N₄ | AlN | Ca₃N₂ | EuN |
|---|---|---|---|---|
| 19 | 44.425 | 38.940 | 15.650 | 0.980 |
| 20 | 24.825 | 21.760 | 52.475 | 0.940 |
| 21 | 19.630 | 17.205 | 62.235 | 0.930 |
| 22 | 20.350 | 35.675 | 43.010 | 0.965 |
| 23 | 16.720 | 29.315 | 53.015 | 0.950 |
| 24 | 28.615 | 25.080 | 45.360 | 0.950 |
| 25 | 43.270 | 25.285 | 30.485 | 0.955 |
| 26 | 37.505 | 21.915 | 39.635 | 0.945 |
| 27 | 17.240 | 45.340 | 36.440 | 0.980 |
| 28 | 14.565 | 38.295 | 46.175 | 0.965 |
| 29 | 29.370 | 38.615 | 31.040 | 0.975 |
| 30 | 25.395 | 33.390 | 40.255 | 0.960 |
| 31 | 38.370 | 33.630 | 27.030 | 0.970 |
| 32 | 3.194 | 93.342 | 2.630 | 0.830 |
| 33 | 3.523 | 92.664 | 2.980 | 0.830 |
| 34 | 4.438 | 90.784 | 3.970 | 0.810 |
| 35 | 5.995 | 87.586 | 5.640 | 0.780 |
| 36 | 9.232 | 80.928 | 9.060 | 0.780 |
| 37 | 20.068 | 58.641 | 20.540 | 0.750 |
| 38 | 4.431 | 90.628 | 2.520 | 2.420 |
| 39 | 5.985 | 87.440 | 4.240 | 2.340 |
| 40 | 9.216 | 80.794 | 7.650 | 2.340 |
| 41 | 20.036 | 58.547 | 19.160 | 2.250 |
| 42 | 9.163 | 80.326 | 2.770 | 7.740 |
| 43 | 19.924 | 58.220 | 14.380 | 7.470 |

TABLE 3

| Example | Exciting wavelength (nm) | Emission wavelength (nm) | Emission intensity (arbitrary unit) |
|---|---|---|---|
| 1 | 465 | 647 | 1.305 |
| 2 | 449 | 649 | 1.099 |
| 3 | 465 | 647 | 1.179 |
| 4 | 465 | 645 | 1.188 |
| 5 | 465 | 652 | 1.351 |
| 6 | 465 | 674 | 0.906 |
| 7 | 465 | 650 | 1.311 |
| 8 | 465 | 647 | 1.073 |
| 9 | 465 | 651 | 0.990 |
| 10 | 465 | 651 | 0.925 |
| 11 | 465 | 650 | 0.851 |
| 12 | 465 | 650 | 0.806 |
| 13 | 465 | 633 | 0.421 |
| 14 | 465 | 641 | 0.388 |
| 15 | 465 | 640 | 0.370 |
| 16 | 465 | 647 | 0.347 |
| 17 | 465 | 648 | 0.361 |
| 18 | 465 | 610 | 0.485 |
| 19 | 465 | 604 | 0.466 |
| 20 | 465 | 649 | 0.720 |
| 21 | 465 | 645 | 0.446 |
| 22 | 465 | 651 | 0.593 |
| 23 | 465 | 647 | 0.403 |
| 24 | 465 | 650 | 0.820 |
| 25 | 465 | 647 | 0.942 |
| 26 | 465 | 651 | 0.587 |
| 27 | 465 | 650 | 0.549 |
| 28 | 465 | 648 | 0.378 |
| 29 | 465 | 650 | 1.260 |
| 30 | 465 | 650 | 0.723 |
| 31 | 465 | 647 | 0.831 |
| 32 | 445 | 666 | 0.388 |
| 33 | 449 | 666 | 0.402 |
| 34 | 449 | 663 | 0.538 |
| 35 | 449 | 657 | 0.640 |
| 36 | 449 | 654 | 0.873 |
| 37 | 450 | 690 | 0.344 |
| 38 | 449 | 682 | 0.439 |
| 39 | 449 | 679 | 0.715 |
| 40 | 449 | 671 | 0.868 |
| 41 | 448 | 668 | 1.604 |
| 42 | 450 | 694 | 0.348 |
| 43 | 450 | 683 | 0.675 |

INDUSTRIAL APPLICABILITY

The nitride phosphors of the present invention exhibit emission at longer wavelengths than those by conventional sialon phosphors and oxynitride phosphors, are excellent as red-aimed phosphors, and are less in luminance deterioration even upon exposure to excitation sources, thereby serving as nitride phosphors preferably usable for VFD, FED, PDP, CRT, white LED, and the like. Thus, the nitride phosphors of the present invention can be expected to be utilized to a great extent in material design of various display devices, thereby contributing to development of the industry.

The invention claimed is:

1. A phosphor comprising:
   a mixture of $CaAlSiN_3$ crystal and an AlN crystal,
   wherein the $CaAlSiN_3$ crystal is activated with Eu, and
   wherein the phosphor emits fluorescence having a peak at a wavelength in a range of 570 nm to 700 nm, by irradiation of an excitation source.

2. The phosphor according to claim 1, wherein the $CaAlSiN_3$ crystal has 5 mass % or more.

3. The phosphor of claim 1, wherein the excitation source is a source of ultraviolet light or visible light having a wavelength between 100 nm inclusive and 570 nm inclusive, or an electron beam source or a source of X-rays.

4. A lighting instrument comprising a light-emitting source and a phosphor, wherein at least the phosphor of claim 1 is used in a constituent phosphor.

5. The lighting instrument of claim 4, wherein the light-emitting source is an LED which emits light at a wavelength of 330 to 500 nm.

6. The lighting instrument of claim 4, wherein
   the light-emitting source is an LED which emits light at a wavelength between 330 and 420 nm; and
   the constituent phosphor further comprises:
   a blue light emitting phosphor having an emission peak at a wavelength between 420 nm and 500 nm when excited by the light between 330 and 420 nm; and a green light emitting phosphor having an emission peak at a wavelength between 500 nm and 570 nm when excited by the light between 330 and 420 nm, so that the constituent phosphor emits white light mixedly including red light by the phosphor of claim 1, blue light by the blue light emitting phosphor, and green light by the green light emitting phosphor.

7. The lighting instrument of claim 4, wherein the light-emitting source is an LED for emitting light at a wavelength between 420 and 500 nm; and
   the constituent phosphor further comprises:
   a green light emitting phosphor having an emission peak at a wavelength between 500 nm and 570 nm when excited by the light between 420 and 500 nm, so that the constituent phosphor emits white light by mixedly including red light by the phosphor of claim 1 and green light by the green light emitting phosphor.

8. The lighting instrument of claim 4, wherein the light-emitting source is an LED for emitting light at a wavelength between 420 and 500 nm; and the constituent phosphor further comprises a yellow light emitting phosphor having an emission peak at a wavelength between 550 nm and 600 nm when excited by the light between 420 and 500 nm, so that the constituent phosphor emits white light by mixedly including red light by the phosphor of claim 1 and yellow light by the yellow light emitting phosphor.

9. The lighting instrument of claim 8, wherein the yellow light emitting phosphor is Ca-α-sialon including Eu dissolved therein in a solid state.

10. An image displaying apparatus comprising an excitation source and a phosphor, wherein the phosphor include the phosphor of claim 1.

11. The image displaying apparatus of claim 10, wherein the image displaying apparatus comprises at least one of a vacuum fluorescent display, a field emission display, a plasma display panel, or a cathode ray tube.

* * * * *